United States Patent
Fujimoto et al.

(10) Patent No.: US 7,504,760 B2
(45) Date of Patent: Mar. 17, 2009

(54) SURFACE ACOUSTIC WAVE ELEMENT AND METHOD OF MANUFACTURING THE SAME

(75) Inventors: Haruhiko Fujimoto, Fukushima-ken (JP); Takeshi Ikeda, Fukushima-ken (JP); Toshihiro Meguro, Fukushima-ken (JP); Satoshi Waga, Fukushima-ken (JP); Kyosuke Ozaki, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 392 days.

(21) Appl. No.: 11/239,234

(22) Filed: Sep. 27, 2005

(65) Prior Publication Data

US 2006/0076851 A1 Apr. 13, 2006

(30) Foreign Application Priority Data

Oct. 8, 2004 (JP) .............................. 2004-295677

(51) Int. Cl.
*H03H 9/125* (2006.01)
(52) U.S. Cl. .............................. 310/313 B; 310/313 R; 333/189; 333/195
(58) Field of Classification Search ................. 310/313; 333/189–195
See application file for complete search history.

(56) References Cited

U.S. PATENT DOCUMENTS

| 5,996,199 | A | 12/1999 | Ichikawa et al. |
| 6,416,934 | B1 * | 7/2002 | Yamagishi ................... 430/314 |
| 2005/0127794 | A1 * | 6/2005 | Ozaki et al. ................. 310/346 |

FOREIGN PATENT DOCUMENTS

| EP | 616426 A1 * | 9/1994 |
| EP | 0 734 120 | 9/1996 |
| EP | 1 391 988 | 2/2004 |
| JP | 7-15274 | 1/1995 |
| JP | 10032464 A * | 2/1998 |
| JP | 2001168671 A * | 6/2001 |
| JP | WO 02/35702 | 5/2002 |
| JP | 2004266632 A * | 9/2004 |

OTHER PUBLICATIONS

Search Report dated Jul. 13, 2006, for corresponding European Patent Application No. 05021677.9.
"Piezoelectric Materials for Acoustic Wave Applications" Gualtieri J. G. et al., IEEE Transactions on Ultrasonics, Ferroelectrics and Frequency Control, IEEE Service Center, Piscataway, NJ, US, vol. 41, No. 1, Jan. 1994, pp. 53-59, XP000503262, ISSN: 0885-3010, *p. 55*.

* cited by examiner

*Primary Examiner*—Jaydi SanMartin
(74) *Attorney, Agent, or Firm*—Brinks Hofer Gilson & Lione

(57) ABSTRACT

A surface acoustic wave element having power resistance is provided. In the surface acoustic wave element, upper dispersion preventing layers and side dispersion preventing layers each made of metal nitride are provided between interdigital transducer electrode portions and an insulating layer. Further, lower dispersion preventing layers made of metal nitride are provided between the interdigital transducer electrode portions and a piezoelectric substrate. If dispersion preventing layers made of 'metal nitride' are provided between the interdigital transducer electrode portions and the insulating layer, even though the insulating layer is formed, it is possible to prevent voids from being generated in the interdigital transducer electrode portions, unlike a related art. Therefore, the power resistance can be improved.

10 Claims, 9 Drawing Sheets

SURFACE ACOUSTIC WAVE ELEMENT AND METHOD OF MANUFACTURING THE SAME

BACKGROUND OF THE INVENTION

1. Field of the Invention

The present invention relates to a surface acoustic wave element having an electrode structure which is capable of representing high power resistance in a high frequency band and a method of manufacturing the same.

2. Description of the Related Art

Surface acoustic wave elements are electronic components using surface acoustic waves which are propagated in a state where mechanical vibration energy is intensively propagated only around surfaces of solid substances, and are used to construct filters, resonators, duplexers, etc.

Recently, a decrease in size and a decrease in weight of mobile communication terminals such as cellular phones have rapidly advanced, and thus a decrease in size of electronic components mounted on the mobile communication terminals has been required.

A surface acoustic wave element has a structure where a pair of interdigital transducer electrodes (IDT electrodes), which are made of a conductive material, are opposite to each other on a piezoelectric substrate and fingers thereof are alternately arranged. The surface acoustic wave element having such a simple structure is able to decrease the size of filters, resonators, duplexers or the like mounted on the mobile communication terminals.

A method of forming the interdigital transducer electrode portions of the surface acoustic wave element according to the related art will now be described. A first metal layer 4 made of an Al alloy, a second metal layer 5 made of Ti, and a third metal layer 6 made of an Al alloy, which adjusts the thickness of the electrodes, are sequentially formed on a substrate 1. Then, a pattern is formed through an ion milling method using Ar as a milling gas, and at this time, dispersion preventing layers 8 are formed on side walls of the electrodes, as shown in FIG. 10. The forming material of the dispersion preventing layers 8 is a mixture of the materials of the first metal layer 4, the second metal layer 5, and the third metal layer 6, that is, a mixture of an Al alloy and Ti. This surface acoustic wave element is disclosed in JP-A-2002-035702 (see pages 10 and 11 and FIGS. 21 and 22). In addition, as disclosed in JP-A-2002-035702, a protective film 9 made of silicon nitride is formed around the interdigital transducer electrode portions (electrode films), as shown in FIG. 11.

In addition, in a case in which the surface acoustic wave element is used as a resonator, it is important that variations of a serial resonant frequency and a parallel resonant frequency when the element temperature changes be reduced.

According to technologies disclosed in JP-A-7-15274 (see FIG. 1) and JP-A-8-265088 (see FIG. 1), the interdigital transducer electrodes and the piezoelectric substrate are covered with a silicon oxide film, so that variations of a serial resonant frequency and a parallel resonant frequency when the element temperature changes can be reduced.

However, if the interdigital transducer electrodes and the piezoelectric substrate are covered with a silicon oxide film, there is a problem in that voids are generated in the interdigital transducer electrode portions.

FIG. 12 is a plan view of a conventional surface acoustic wave element. The surface acoustic wave element has a structure in which an interdigital transducer electrode portion 13 and an interdigital transducer electrode portion 14 are formed on the piezoelectric substrate 12. The interdigital transducer electrodes 13 and 14 and the piezoelectric substrate 12 are covered with a silicon oxide film, which is not shown in FIG. 12. Connection electrode portions 15 and 16, which connect the surface acoustic wave element to external circuits, are electrically connected to the interdigital transducer electrode portions 13 and 14. FIG. 13 is a cross-sectional view of the interdigital transducer electrode portions 13 and 14, which are taken along one-dot chain line and viewed in the direction of the arrow. The section of the interdigital transducer electrode portions 13 and 14 shown in FIG. 13 is the same as that shown in FIG. 10, and the dispersion preventing layers 8 are formed at both sides. The interdigital transducer electrode portions 13 and 14 and the piezoelectric substrate 12 are covered with the silicon oxide film 10.

As shown in FIGS. 12 and 13, voids B are generated in the interdigital transducer electrode portions 13 and 14. In a heat treatment process in an atmosphere of oxygen and water when the silicon oxide film is formed on the interdigital transducer electrode portions 13 and 14 and the piezoelectric substrate 12, the forming materials of the interdigital transducer electrode portions 13 and 14 are dispersed in the insulating layer 10 and the oxygen and vapor are dispersed in the interdigital transducer electrode portions 13 and 14. As a result, the voids B are generated. In particular, when the interdigital transducer electrode portions 13 and 14 are formed of Cu or a Cu alloy, the voids are easily generated.

The conventional dispersion preventing layers 8 contain a mixture of an Al alloy and Ti, silicon nitride, or Ta. However, the dispersion preventing layers 8 formed of the above-mentioned materials cannot sufficiently prevent the oxygen and the water from dispersing into the interdigital transducer electrode portions 13 and 14.

SUMMARY OF THE INVENTION

The invention has been finalized in view of the inherent drawbacks in the conventional antenna, and it is an object of the invention to provide a surface acoustic wave element in which when an interdigital transducer electrode portions and a piezoelectric substrate are covered with a silicon oxide film, a void is prevented from being generated in the interdigital transducer electrode portions, thereby improving power resistance, and a method of manufacturing the same.

According to a first aspect of the invention, a surface acoustic wave element includes a piezoelectric substrate and interdigital transducer electrode portions formed thinly on the piezoelectric substrate. The interdigital transducer electrode portions and the piezoelectric substrate are covered with an insulating layer made of an insulating material having a temperature-elasticity constant variation characteristic opposite to a temperature-elasticity constant variation characteristic of the piezoelectric substrate, and dispersion preventing layers each made of metal nitride are provided between the interdigital transducer electrode portions and the insulating layer.

According to this aspect, since the dispersion preventing layers made of 'the metal nitride' are provided between the interdigital transducer electrode portions and the insulating layer, it is possible to prevent the voids from being generated in the interdigital transducer electrode portions, and the power resistance can be improved. In addition, by forming the insulating layer, variations of a serial resonant frequency and a parallel resonant frequency when the element temperature changes can be reduced.

Further, the dispersion preventing layers may be formed at the sides, the lower sides, or the upper sides of the interdigital transducer electrode portions.

If the interdigital transducer electrode portions are formed of Cu or a Cu alloy, since the voids are easily generated, it is effective that the invention is applied to the surface acoustic wave element in which the interdigital transducer electrode portions are formed of Cu or a Cu alloy.

Furthermore, the dispersion preventing layers may have one or more of TaN, VN, NbN, TiN, AlN, ZrN, and CrN.

Preferably, the piezoelectric substrate is made of $LiTaO_3$, and the insulating material is silicon oxide or aluminum oxide.

Preferably, the insulating layer is formed through a spin-on-glass method which applies a silicon compound and performs a heat treatment for the applied silicon compound. Preferably, in the spin-on-glass method, the heat treatment is performed in an atmosphere of any one of oxygen or $H_2O$, or in an atmosphere of oxygen and $H_2O$. Preferably, the insulating film is an oxide film.

According to a second aspect of the invention, a method of manufacturing a surface acoustic wave element includes: (a) forming a conductive layer on a piezoelectric substrate; (b) forming a mask layer made of a metal material on the conductive layer so as to have the same planar pattern shape as interdigital transducer electrode portions; (c) forming the interdigital transducer electrode portions by cutting the conductive layer through an ion milling method which uses a mixed gas of Ar and $N_2$ as a milling gas, using the mask layer as a mask, and forming side dispersion preventing layers made of metal nitride containing a forming material of the mask layer at sides of the interdigital transducer electrode portions; and (d) forming an insulating layer by applying an insulating material having a temperature-elasticity constant variation characteristic opposite to a temperature-elasticity constant variation characteristic of the piezoelectric substrate on the piezoelectric substrate and the interdigital transducer electrode portions.

Preferably, in (c) the forming interdigital transducer electrode portions and side dispersion preventing layers, the interdigital transducer electrode portions can be formed by cutting the conductive layer through the ion milling method which uses the mixed gas of Ar and $N_2$ as the milling gas, and at the same time, the side dispersion preventing layers made of metal nitride containing a forming material of the mask layer can be formed at the sides of the interdigital transducer electrode portions. In addition, since the dispersion preventing layers made of 'the metal nitride' is provided between the interdigital transducer electrode portions and the insulating layer, it is possible to prevent the voids from being generated in the interdigital transducer electrode portions, and thus the power resistance can be improved.

In (b) the forming a mask layer, when the mask layer is formed of one or more of Ta, V, Nb, Ti, Al, Zr, and Cr, in (c) the forming interdigital transducer electrode portions and side dispersion preventing layers, the side dispersion preventing layers can be formed of one or more of TaN, VN, NbN, TiN, AlN, ZrN, and CrN.

According to a third aspect of the invention, a method of manufacturing a surface acoustic wave element includes: (e) forming a conductive layer on a piezoelectric substrate; (f) forming a mask layer made of metal nitride on the conductive layer so as to have the same planar pattern shape as interdigital transducer electrode portions; (g) forming the interdigital transducer electrode portions by cutting the conductive layer through an ion milling method, using the mask layer as a mask, and forming side dispersion preventing layers made of metal nitride containing a forming material of the mask layer at sides of the interdigital transducer electrode portions; and (h) forming an insulating layer by applying an insulating material having a temperature-elasticity constant variation characteristic opposite to a temperature-elasticity constant variation characteristic of the piezoelectric substrate on the piezoelectric substrate and the interdigital transducer electrode portions.

According to this aspect, the mask layer can be formed using the metal nitride, the interdigital transducer electrode portion can be formed by cutting the conductive layer through the ion milling method, and the side dispersion preventing layer made of metal nitride containing the forming material of the mask layer can be at the side of the interdigital transducer electrode portion. In addition, since the dispersion preventing layer made of 'the metal nitride' is provided between the interdigital transducer electrode portion and the insulating layer, it is possible to prevent the voids from being generated in the interdigital transducer electrode portion, and thus the power resistance characteristic can be improved. In addition, by forming the insulating layer, variations of a serial resonant frequency and a parallel resonant frequency when the element temperature changes can be reduced.

In (f) the forming a mask layer, when the mask layer is formed of one or more of TaN, VN, NbN, TiN, AlN, ZrN, and CrN, in (g) the forming interdigital transducer electrode portions and side dispersion preventing layers, the side dispersion preventing layers can be formed of one or more of TaN, VN, NbN, TiN, AlN, ZrN, and CrN.

In the invention, preferably, in (g) the forming interdigital transducer electrode portions and side dispersion preventing layers, a mixed gas of Ar and $N_2$ is used as an ion milling gas.

Preferably, the method of manufacturing a surface acoustic wave element further includes: (i) forming a metal nitride film at upper sides and sides of the interdigital transducer electrode portions between (c) the forming interdigital transducer electrode portions and side dispersion preventing layers and (d) the forming an insulating layer. The metal nitride film can be formed of one or more of TaN, VN, NbN, TiN, AlN, ZrN, and CrN.

Preferably, in (a) the forming a conductive layer, the conductive layer is formed on the piezoelectric substrate with lower dispersion preventing layers made of metal nitride interposed therebetween. The lower dispersion preventing layers function as base layers of the conductive layer.

Preferably, the method of manufacturing a surface acoustic wave element further includes: (j) forming upper dispersion preventing layers made of metal nitride on the conductive layer between (a) the forming a conductive layer and (b) the forming a mask layer.

Preferably, the upper dispersion preventing layers or the lower dispersion preventing layers are formed of one or more of TaN, VN, NbN, TiN, AlN, ZrN, and CrN.

Preferably, the method of manufacturing a surface acoustic wave element further includes: (k) performing a heat treatment for the insulating layer after (d) the forming an insulating layer. Preferably, the heat treatment is performed in an atmosphere of any one of oxygen or $H_2O$, or in an atmosphere of oxygen and $H_2O$, and the insulating layer is oxidized. Preferably, the heat treatment is performed at a temperature of 400° C. or more.

Preferably, the piezoelectric substrate is made of $LiTaO_3$ and the insulating layer is formed using a silicon compound as the insulating material to include silicon oxide as a major component. Therefore, a temperature-elasticity constant variation characteristic of the piezoelectric substrate can be opposite to a temperature-elasticity constant variation characteristic of the insulating layer.

The temperature-elastic constant variation characteristic of the substrate or the insulating layer means the direction and magnitude of the elastic constant variation when a temperature changes. For example, when the temperature increases, the elastic constant of LiTaO$_3$ decreases, and when the temperature increases, the elastic constant of silicon oxide increases. At this time, it is said that LiTaO$_3$ and silicon oxide have temperature-elasticity constant variation characteristics opposite to each other.

Preferably, in (b) the forming a mask layer, the thickness of the mask layer is within a range of 1/20 times the thickness of the conductive layer to one time the thickness of the conductive layer.

Preferably, in (b) the forming a mask layer, the mask layer is patterned through a reactive ion etching (RIE) method.

Preferably, the method of manufacturing a surface acoustic wave element further includes: (l) forming a stopper layer on the conductive layer or the upper dispersion preventing layers between (a) the forming a conductive layer and (b) the forming a mask layer. Preferably, in (b) the forming a mask layer, the mask layer is formed on the stopper layer, and pattern forming of the mask layer is stopped at a location of the stopper layer.

The stopper layer can be formed of one or more of Cr, Al, Ni, and Pt. Basically, it is preferable that the stopper layer be formed of a material whose etching speed through the RIE using the CF$_4$ gas is slower than the etching speed of the mask layer.

Preferably, in (b) the forming a mask layer, if the reactive ion etching (RIE) method is used, even though the pattern of the mask layer is formed using a resist photolithography method, it is possible to pattern the mask layer correctly.

Preferably, the method of manufacturing a surface acoustic wave element further includes: (m) removing the mask layer after (c) the forming interdigital transducer electrode portions and side dispersion preventing layers.

By removing the mask layer, the mass of the interdigital transducer electrode portion can be reduced, so that the characteristic of the surface acoustic wave element can be improved.

In (m) removing the mask layer, if the mask layer is removed through a reactive ion etching (RIE) method, the forming material of the mask layer is attached to the sides of the interdigital transducer electrode portions, and the side dispersion preventing layers are formed. As a result, the thicknesses of the side dispersion preventing layers increase, so that it is possible to prevent the voids from being generated in the interdigital transducer electrode portions.

Preferably, in (a) the forming a conductive layer, the conductive layer is formed of an alloy of a Cu element and one or more of Ag, Sn, C, Sc, and Cu. Also, the conductive layer may be formed of an alloy of a Cu element and one or more of Ag, Sn, C, Sc, and Cu.

DESCRIPTION OF THE PREFERRED EMBODIMENT

Figure 1:
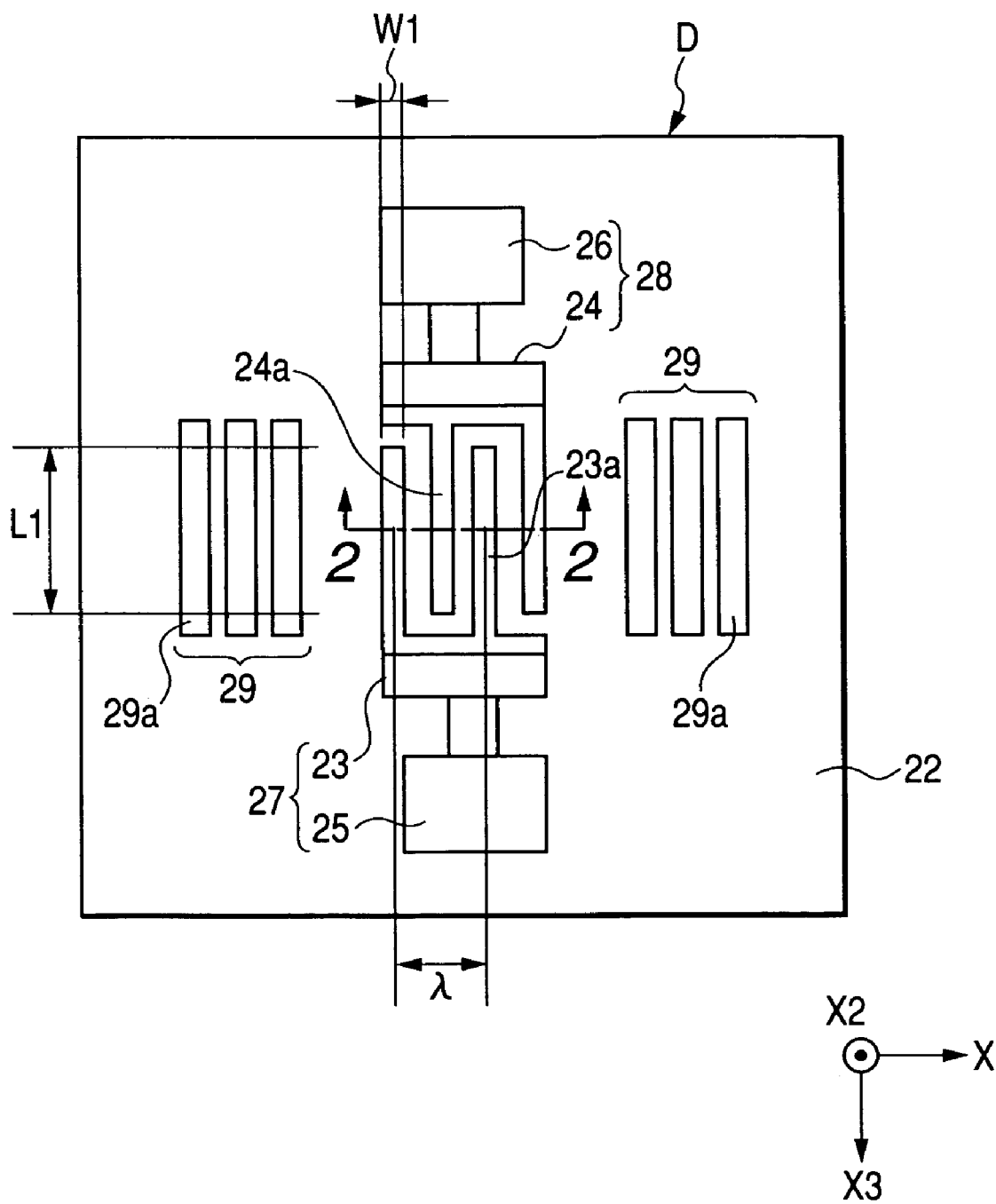
FIG. 1 is a plan view of a surface acoustic wave element formed by using a method of manufacturing a surface acoustic wave element of the invention.

FIG. 1 is a plan view showing a surface acoustic wave element according to an embodiment of the invention.

Reference numeral D indicates a surface acoustic wave element and the surface acoustic wave element D functions as a resonator.

Reference numeral 22 indicates a piezoelectric substrate. In the present embodiment, the piezoelectric substrate 22 is formed of, for example, LiTaO$_3$ and LiNbO$_3$. An interdigital transducer electrode portion 23 and an interdigital transducer electrode portion 24 are formed on the piezoelectric substrate 22. Fingers 23a extending in a direction opposite to the X3 direction shown in the figure and fingers 24a extending in the X3 direction shown in the figure are respectively provided in the interdigital transducer electrode portion 23 and the interdigital transducer electrode portion 24, respectively. The fingers 23a of the interdigital transducer electrode portion 23 and the fingers 24a of the interdigital transducer electrode portion 24 are alternately arranged in the X direction shown in the figure at a predetermined interval.

Further, connection electrode portions 25 and 26 for connecting the surface acoustic wave element to external circuits are electrically connected to the interdigital transducer electrode portion 23 and the interdigital transducer electrode portion 24.

The interdigital transducer electrode portion 23 and the connection electrode portion 25 constitute an electrode portion 27, and the interdigital transducer electrode portion 24 and the connection electrode portion 26 constitute an electrode portion 28.

In the embodiment shown in FIG. 1, the fingers 23a of the interdigital transducer electrode portion 23 and the fingers 24a of the interdigital transducer electrode portion 24 have the same width W1 and a gap λ between the fingers 23a and 23a and between the fingers 24a and 24a (hereinafter, referred to as 'pitch between electrodes') is constant. The pitch λ between electrodes is defined as a distance between the centers of the widths of the adjacent fingers 23a and 23a (24a and 24a).

The fingers 23a and the fingers 24a are alternated with a length of L1. Further, the pitch λ between electrodes is within a range of 0.6 to 10 μm, the width W1 is about ¼ of the pitch λ between electrodes, and the length L1 is within a range of 6 to 1000 μm.

In the present embodiment, the interdigital transducer electrode portion 23 and the interdigital transducer electrode portion 24 are made of Cu or a Cu alloy. Here, the Cu alloy is, for example, an alloy containing a small amount of Ag, Sn, and C in Cu. The contents of Ag, Sn, and C as additive elements may be in a range where the specific gravity of the Cu alloy is approximately equal to the specific gravity of pure Cu. Specifically, when the mass percentage of the additive elements to the Cu alloy is within a range of 0.5 to 10.0 mass percentage, the specific gravity of the Cu alloy is approximately equal to the specific gravity of pure Cu.

In FIG. 1, with a predetermined distance in the X direction and the direction opposite to the X direction from the interdigital transducer electrode portion 23 and the interdigital transducer electrode portion 24, respectively, reflectors 29 in which a plurality of rectangular electrodes (strips) 29a are arranged in the X direction shown in the figure are formed at a predetermined distance. In FIG. 1, ends of the respective electrodes constituting the reflectors 29 are open-circuited to one another. However, the ends of the respective electrodes constituting the reflectors 29 may be short-circuited to one another.

The connection electrode portions 25 and 26 and the reflectors 29 may be made of the same material as the interdigital transducer electrode portions 23 and 24, or may be made of other conductive material such as Au or the like.

Figure 2:
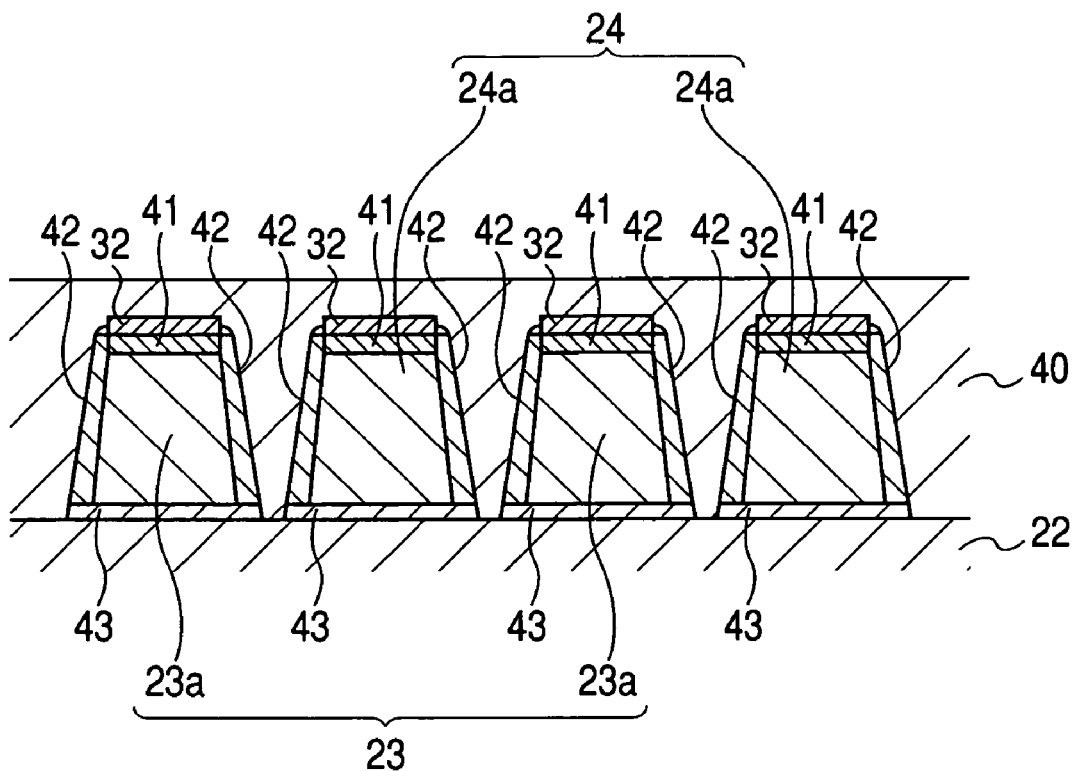
FIG. 2 is a partial cross-sectional view of the surface acoustic wave element which is taken along the line II-II of FIG. 1 and is viewed in the direction of the arrow.

FIG. 2 is a cross-sectional view of the surface acoustic wave element D which is taken along the line II-II of FIG. 1 and is viewed in the direction of the arrow.

The piezoelectric substrate 22 and the interdigital transducer electrode portions 23 and 24 are covered with an insulating layer 40. The connection electrode portions 25 and 26 are exposed without being covered with the insulating layer 40. In FIG. 1, in order to shows clearly the planar structure of the electrode portions 27 and 28 and the reflectors 29 formed in the piezoelectric substrate 22, the insulating layer 40 is not shown.

The piezoelectric substrate 22 is made of $LiTaO_3$, and the insulating layer 40 is made of silicon oxide ($SiO_2$). An insulating thin film may be formed of silicon oxide ($SiO_2$) on the interdigital transducer electrode portions 23 and 24 by sputtering.

Further, a thickness t of the interdigital transducer electrode portions 23 and 24 is within a range of 50 to 200 nm, and a thickness H of the insulating layer 40 (a maximum value of a thickness from an upper surface 12a of the piezoelectric substrate 22 to an upper surface 21a of the insulating layer 40) is within a range of 50 to 500 nm.

A temperature-elastic constant variation characteristic of a substrate or an insulating layer means the direction and magnitude of an elastic constant variation when a temperature changes. For example, when the temperature increases, the elastic constant of $LiTaO_3$ decreases, and when the temperature increases, the elastic constant of silicon oxide increases. At this time, $LiTaO_3$ and silicon oxide have temperature-elasticity constant variation characteristics opposite to each other.

When the piezoelectric substrate 12 and the insulating layer 40 are formed using $LiTaO_3$ and silicon oxide having temperature-elasticity constant variation characteristics opposite to each other, variations of a serial resonant frequency and a parallel resonant frequency when the element temperature changes can be reduced. When the insulating layer 40 is formed of the silicon oxide, it is preferable that the insulating layer 40 be formed by a spin-on-glass method for coating a silicon compound and applying a heat treatment to the silicon compound. In the spin-on-glass method, the heat treatment is performed in an atmosphere of any one of oxygen or $H_2O$, or in atmospheres of both of oxygen and $H_2O$. Therefore, the insulating layer 40 becomes an oxidization film.

Further, $LiTaO_3$ and aluminum nitride (AlN) also constitute a combination in which the temperature-elasticity constant variation characteristics are opposite to each other.

Although not shown in FIG. 2, in the present embodiment, the reflectors 29 are covered with the insulating layer 40 with the insulating thin film 20 interposed therebetween.

In the present embodiment, the insulating layer 40 is a thin film having a uniform density. In addition, "the insulating layer 40 has a uniform density" means that the insulating material exists in all the areas without voids or cracks at the inside of the insulating layer 40, specifically, around the interdigital transducer electrode portions.

When one of the connection electrode portion 25 and the connection electrode portion 26 of the surface acoustic wave element 21 is set to a ground side and a high frequency signal is applied to the other electrode portion, surface waves are excited on the surface of the piezoelectric substrate 22 and the excited surface waves are propagated in the X direction, shown in the figure, and in the anti-parallel direction of the X direction. The surface waves are reflected by the reflectors 29 and return to the interdigital transducer electrode portions 23 and 24. The surface acoustic wave element 21 has a resonant frequency and an anti-resonant frequency, and has the highest impedance at the anti-resonant frequency.

The piezoelectric substrate 22 made of $LiTaO_3$ according to the present embodiment is a rotation Y-cut $LiTaO_3$ substrate of which the rotational cut angle θ (cut angle) from the Y-axis to the Z-axis about the X-axis is within a range of 36° to 56°.

A characteristic portion according to the present embodiment will be described.

In addition, upper dispersion preventing layers 41 and side dispersion preventing layers 42 each made of metal nitride are provided between the interdigital transducer electrode portions 23 and 24 and the insulating layer 40 of the surface acoustic wave element according to the present embodiment. Further, lower dispersion preventing layers 43 each made of metal nitride are provided between the interdigital transducer electrode portions 23 and 24 and the piezoelectric substrate 22. These upper dispersion preventing layers 41, the side dispersion preventing layers 42, and the lower dispersion preventing layers 43 are dispersion preventing layers of the invention.

The metal oxide, which forms the upper dispersion preventing layers 41, the side dispersion preventing layers 42, and the lower dispersion preventing layers 43, contains one or more of TaN, VN, NbN, TiN, AlN, ZrN, and CrN.

If the dispersion preventing layers each made of 'the metal nitride' are provided between the interdigital transducer electrode portions 23 and 24 and the insulating layer 40, even though the insulating layer 40 is provided, the voids are not generated in the interdigital transducer electrode portions. Therefore, it is possible to improve a power resistance characteristic.

Specifically, if the interdigital transducer electrode portions 23 and 24 are formed of Cu or a Cu alloy, since the voids may be easily generated, it is effective that the invention is applied to the surface acoustic wave element of which the interdigital transducer electrode portions 23 and 24 are formed of Cu or a Cu alloy.

A method of manufacturing the surface acoustic wave element shown in FIG. 1 will now be described.

FIGS. 3 to 6 are cross-sectional views showing a process of manufacturing the interdigital transducer electrode portions 23 and 24 of the surface acoustic wave element D. FIGS. 3 to 6 are cross-sectional views of the surface acoustic wave element D which is taken along the line II-II of FIG. 1 and is viewed in the direction of the arrow.

Figure 3:
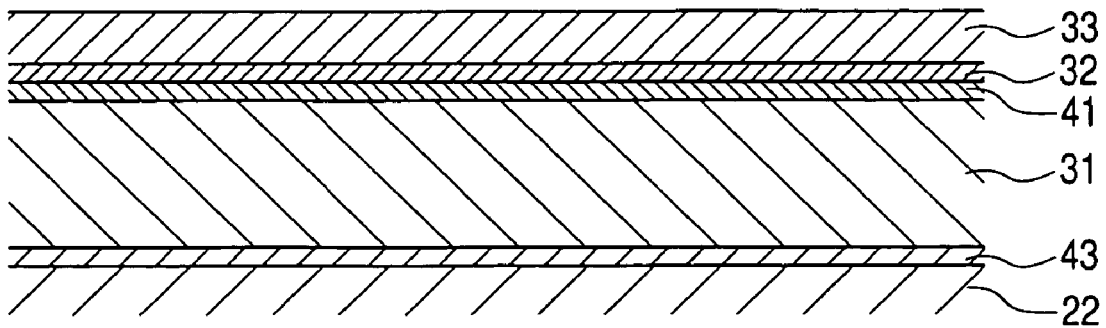
FIG. 3 is a partial cross-sectional view illustrating one process of a method of manufacturing a comb-like electrode of the surface acoustic wave element of FIG. 1.

In a process shown in FIG. 3, using a sputtering method or a deposition method, on the piezoelectric substrate 22, the low dispersion preventing layer 43, a conductive layer 31, the upper dispersion preventing layer 41, a stopper layer 32, and a mask layer 33 are continuously formed in a vacuum state. A thickness of the lower dispersion preventing layer 43 is within a range of 2 to 10 nm, a thickness of the conductive layer 31 is within a range of 40 to 150 nm, a thickness of the upper dispersion preventing layer 41 is within a range of 2 to 10 nm, a thickness of the stopper layer 32 is within a range of 2 to 10 nm, and a thickness of the mask layer 33 is within a range of 2 to 150 nm.

The lower dispersion preventing layer 43 (base layer) and the upper dispersion preventing layer 41 are formed of one or more of TaN, VN, NbN, TiN, AlN, ZrN, and CrN. In particular, it is preferable that they be formed of a material whose etching speed through ion milling is slower than the etching speed of the conductive layer 31 (interdigital transducer electrode portions 23 and 24). More specifically, it is preferable that they be formed of TiN.

The conductive layer 31 is formed using an alloy of one or more of, for example, Cu, Al, Pt, Au or Ag, or an alloy of one or more of Cu, Al, Pt, Au or Ag, and one or more of Ag, Sn, C, and Sc. Specifically, the material for forming the conductive layer 31 is an alloy containing a small amount of Ag, Sn, and C in Cu. The contents of Ag, Sn, and C as additive elements may be within a range where the specific gravity of the Cu alloy is approximately equal to the specific gravity of pure Cu. Specifically, when the mass percentage of the additive elements to the Cu alloy is within a range of 0.5 to 10.0 mass percentage, the specific gravity of the Cu alloy is approximately equal to the specific gravity of pure Cu.

The stopper layer 32 is formed using one or more of, for example, Cr, Al, Ni, and Pt. Basically, it is preferable that it be formed of a material whose etching speed through an RIE using $CF_4$ gas is slower than the etching speed of the mask layer 33. The stopper layer may be formed of a multilayer film made of two layers or more.

The mask layer 33 is formed of a metallic material. The metallic material is, for example, metal nitride made of one or more of TaN, VN, NbN, TiN, AlN, ZrN, and CrN.

Figure 4:
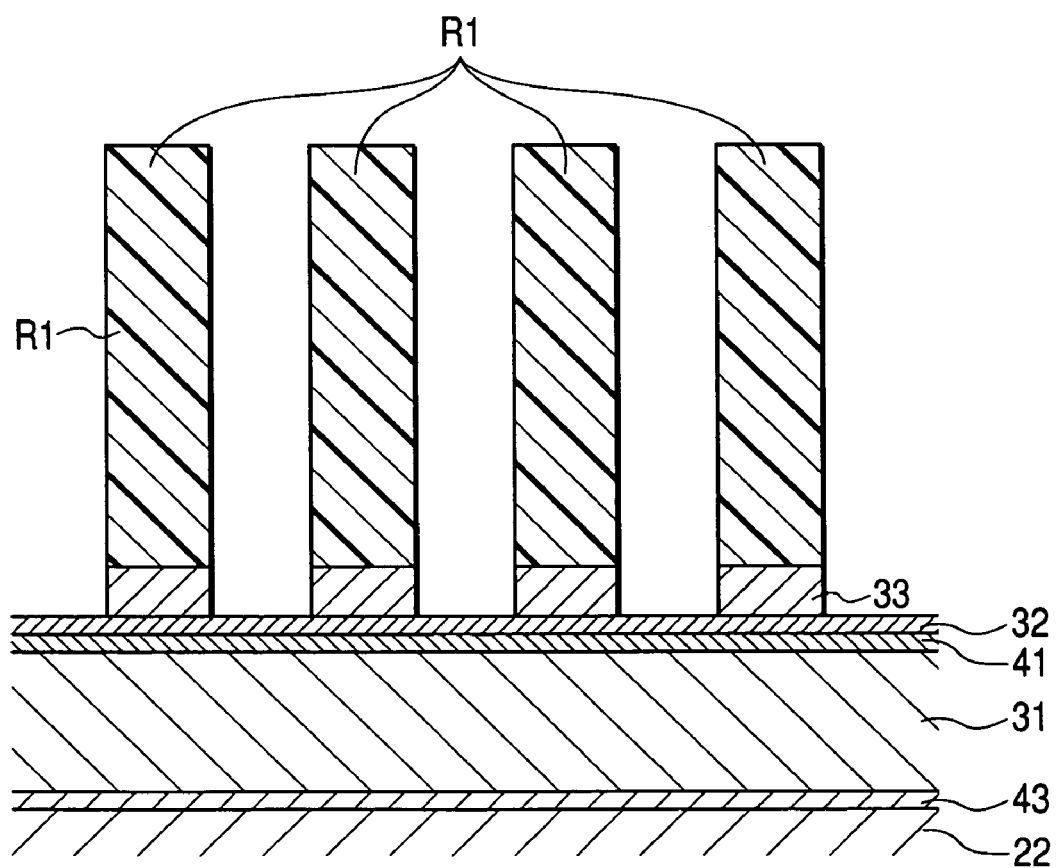
FIG. 4 is a partial cross-sectional view illustrating another process of a method of manufacturing a comb-like electrode of the surface acoustic wave element of FIG. 1.

Next, in a process shown in FIG. 4, the mask layer 33 is patterned such that it has the same planar shape as the interdigital transducer electrode portions 23 and 24, the connection electrode portions 25 and 26, and the reflectors 29 shown in FIG. 4. In the present embodiment, resist layers R1 are laminated on the mask layer 33, the resist layers R1 are exposed and developed by using i-lines, such that concave portions having a desired pattern shape are formed. Then, the mask layers 33 are cut by a reactive ion etching (RIE) method using $CF_4$ gas. In addition, the substrate temperature is about 60° C. at the time of performing the RIE for cutting the mask layers 32. The stopper layer 32 formed below the mask layers 33 is formed of a material, such as, for example, Cr, Al, Ni, and Pt. In the stopper layer 32, the etching speed through the RIE using $CF_4$ gas is slower than the etching speed of the mask layer 33. Therefore, it is easy to finish the RIE at the location of the stopper layer 32.

Figure 5:
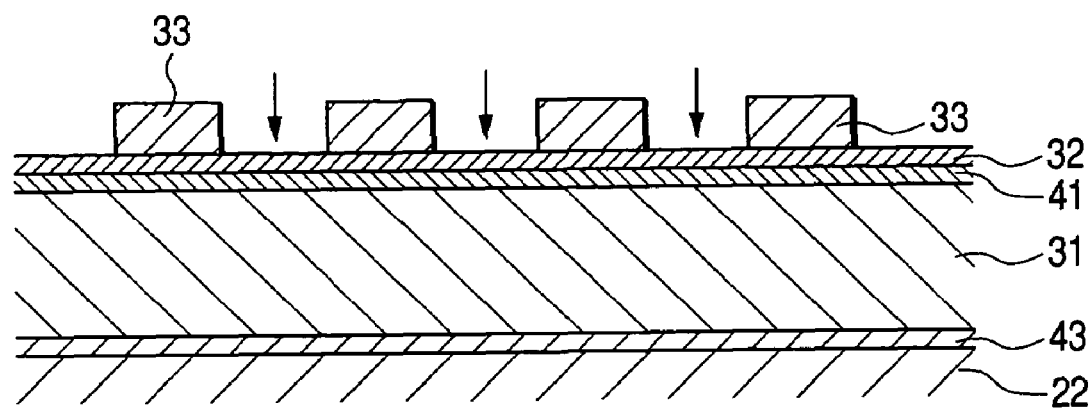
FIG. 5 is a partial cross-sectional view illustrating a further process of a method of manufacturing a comb-like electrode of the surface acoustic wave element of FIG. 1.

Next, the resist layers R1 are removed. As shown in FIG. 5, the conductive layer 31 is cut through an ion milling method which uses the mask layers 33 as masks and a mixed gas of Ar and $N_2$ as a milling gas, such that the interdigital transducer electrode portions 23 and 24 are then formed. At the time of milling, the incident angle of ion beam is within a range of 0 to 60° from a normal direction of the piezoelectric substrate 22.

In this process, the side dispersion preventing layers 42 containing the forming material of the mask layer 32 are attached to the sides of the interdigital transducer electrode portions 23 and 24. At the time of performing the ion milling shown in FIG. 5, the substrate temperature is about 100° C. As such, according to the invention, it is possible to simultaneously form the interdigital transducer electrode portions 23 and 24 and the side dispersion preventing layers 42 through the etching of the conductive layer 31.

If the conductive layer 31 is cut through the ion milling method which uses a mixed gas of Ar and $N_2$ as a milling gas, each of the side dispersion preventing layers 42 is formed of metal nitride containing the forming material of the mask layer. Specifically, the side dispersion preventing layer 42 has one or more of TaN, VN, NbN, TiN, AlN, ZrN, and CrN.

In addition, even though the mask layer is formed of a material not containing nitrogen, for example, one or more of Ta, V, Nb, Ti, Al, Zr, and Cr, if the conductive layer 31 is cut through the ion milling method which uses a mixed gas of Ar and $N_2$ as a milling gas, each of the side dispersion preventing layers 42 is formed of metal nitride containing the forming material of the mask layer. Specifically, the side dispersion preventing layer 42 has one or more of TaN, VN, NbN, TiN, AlN, ZrN, and CrN.

In addition, in the case in which the mask layer 33 is formed of metal nitrides containing one or more of TaN, VN, NbN, TiN, AlN, ZrN, and CrN, even though the ion milling of the conductive layer 31 is performed using a milling gas not containing nitrogen, the side dispersion preventing layer 42 may have one or more of TaN, VN, NbN, TiN, AlN, ZrN, and CrN.

The etching of the conductive layer 31 can be performed through the reactive ion etching (RIE) method which uses a Cl system gas. In the RIE method using a Cl system gas, it is necessary that the temperature of the substrate be equal to or greater than 200° C. If the temperature of the piezoelectric substrate 22 is rapidly increased such that it is equal to or greater than 200° C., the piezoelectric substrate 22 may be easily damaged. Therefore, as in the invention, it is preferable that the conductive layer 31 may be cut through the ion milling.

In addition, preferably, the forming materials of the mask layer 33 and the lower dispersion preventing layer 43 are materials in which each of the etching speed using the milling gas used at the time of performing the ion milling is slower than the etching speed of the conductive layer 31 using the milling gas. The slower the etching speed of the mask layer is, the smaller the thickness of the mask layer 33 is.

If the thickness of the mask layer 33 is small, it is easy for milling particles to permeate into the mask layer 33 at the time of ion milling, and thus the conductive layer 31 can be correctly etched. That is, it is possible to correctly machine minute patterns of the interdigital transducer electrode portions 23 and 24. In addition, the cutting refuse of the conductive layer 31 is attached to the mask layer 33 to a low degree and it is possible to prevent the short-circuit of the interdigital transducer electrode portions 23 and 24 from being generated.

Preferably, the thickness of the mask layer 33 is within a range of 1/20 times the thickness of the conductive layer 31, to one time the thickness of the conductive layer 31.

In addition, if the etching speed of the lower dispersion preventing layer 43 is slow, it is easy to correctly finish the ion milling at the location of the lower dispersion preventing layer 43.

Figure 6:
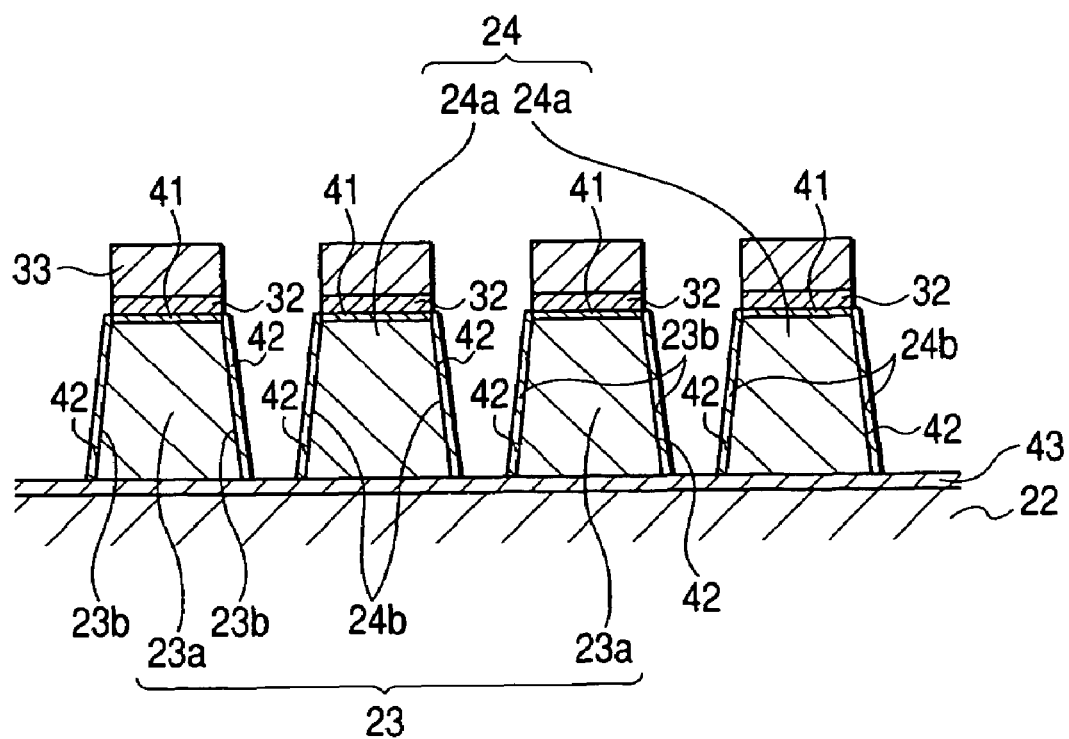
FIG. 6 is a partial cross-sectional view illustrating a further still process of a method of manufacturing a comb-like electrode of the surface acoustic wave element of FIG. 1.

Next, in a process shown in FIG. 6, the mask layer 33 is removed through the reactive ion etching (RIE) method using $CF_4$ gas. In this process, the lower dispersion preventing layer 43 is also removed between the interdigital transducer electrode portions 23 and 24. In this way, the mask layer is removed, so that mass of the interdigital transducer electrode portion can be reduced, which leads to improving the surface acoustic wave element.

In addition, if the mask layer 33 is removed using the RIE method, it is possible to increase the thickness of the side dispersion preventing layers 42 formed on the sides 23b and 24b of the interdigital transducer electrode portions 23 and 24.

After the mask layer 33 is removed, if the insulating layer 40 is coated on the piezoelectric substrate 22 and the interdigital transducer electrode portions 23 and 24, the surface acoustic wave element shown in FIGS. 1 and 2 is obtained.

In the present embodiment, the insulating layer 40 is made of polysilazane (produced by Clariant Japan Co., Ltd.). The polysilazane has a structure in which hydrogen H is added to a ring compound of silicon Si and nitrogen N, and is coated using a spin coating method in a state in which it is melted in a solvent of dibutyl ether. The formed thickness (coating thickness) of the insulating layer 40 has a range of H1=50 to 500 nm.

After applying the insulating layer 40 by the spin coating method, the insulating layer is baked in a nitrogen atmosphere at a temperature of 150° C. for three minutes, thereby removing the solvent of dibutyl ether. In addition, the insulating layer is cured in an atmosphere of oxygen ($O_2$) and vapor ($H_2O$) at a temperature of 400° C. for thirty minutes. Through this curing process, ammonia $NH_3$ or $H_2$ is released, so that the insulating layer 40 becomes a layer containing silicon oxide as a major component.

The temperature-elasticity constant variation characteristic of a substrate or an insulating layer means the direction and the magnitude of variation of an elastic constant when a temperature changes. For example, the elastic constant of $LiTaO_3$ decreases when a temperature increases, and the elastic constant of silicon oxide increases when a temperature increases. At this time, it is said that $LiTaO_3$ and silicon oxide have temperature-elasticity constant variation characteristics opposite to each other. When the piezoelectric substrate 12 and the insulating layer 40 are formed of $LiTaO_3$ and silicon oxide having temperature-elasticity constant variation characteristics opposite to each other, the variation of the serial resonant frequency and the parallel resonant frequency can be reduced when the element temperature changes.

If the upper dispersion preventing layers 41, and the side dispersion preventing layers 42 which are dispersion preventing layers made of 'metal nitride' are provided between the interdigital transducer electrode portions 23 and 24 and the insulating layer 40, when the heat treatment is performed in an atmosphere of oxygen ($O_2$) and vapor ($H_2O$) at a temperature of 400° C. at the time of forming the insulating layer 40, it is possible to sufficiently prevent the materials of the interdigital transducer electrode portions 23 and 24 from diffusing into the insulating layer 40 and the oxygen and water from diffusing into the interdigital transducer electrode portions 23 and 24. Therefore, the interdigital transducer electrode portions 23 and 24 can be formed with the correct dimension without generating the voids in the interdigital transducer electrode portions. In addition, it is possible to improve the characteristic of the power resistance of the surface acoustic wave element.

In particular, if the interdigital transducer electrode portions 23 and 24 are formed of Cu or a Cu alloy, it is easy for the voids to be generated. However, if the upper dispersion preventing layers 41 and the side dispersion preventing layers 42 are provided, it is possible to sufficiently prevent the voids from being generated in the interdigital transducer electrode portions.

In addition, if the sides 23b and 24b of the interdigital transducer electrode portions 23 and 24 is covered with the side dispersion preventing layers 42, since the flow of atoms constituting the interdigital transducer electrode portions 23 and 24 is suppressed, stress migration or electron migration is reduced. In addition, it is prevented that protrusions or indents are generated on the surfaces of the interdigital transducer electrode portions 23 and 24. That is, an electrical characteristic, such as power resistance of the surface acoustic wave element, is improved. In addition, the sides 23b and 24b of the interdigital transducer electrode portions 23 and 24 are covered with the side dispersion preventing layers 42, so that it is difficult for the interdigital transducer electrode portions 23 and 24 to become corroded, which leads to improving chemical tolerance. Further, it is possible to suppress the interdigital transducer electrode portions 23 and 24 from oxidizing.

Figure 7:
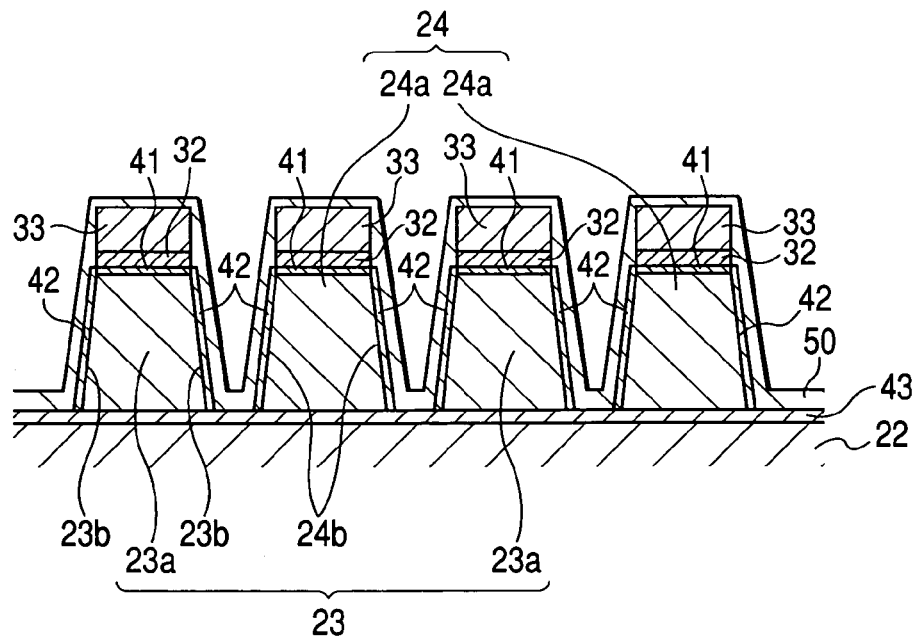
FIG. 7 is a partial cross-sectional view illustrating one process of another method of manufacturing the surface acoustic wave element of the invention.

In addition, after the process shown in FIG. 6, as shown in FIG. 7, metal nitride film 50 may be formed at the upper sides or the sides of the interdigital transducer electrode portions 23 and 24 by using a sputtering method or a deposition method. The metal nitride film 50 is made of one or more of TaN, VN, NbN, TiN, AlN, ZrN, and CrN.

Figure 8:
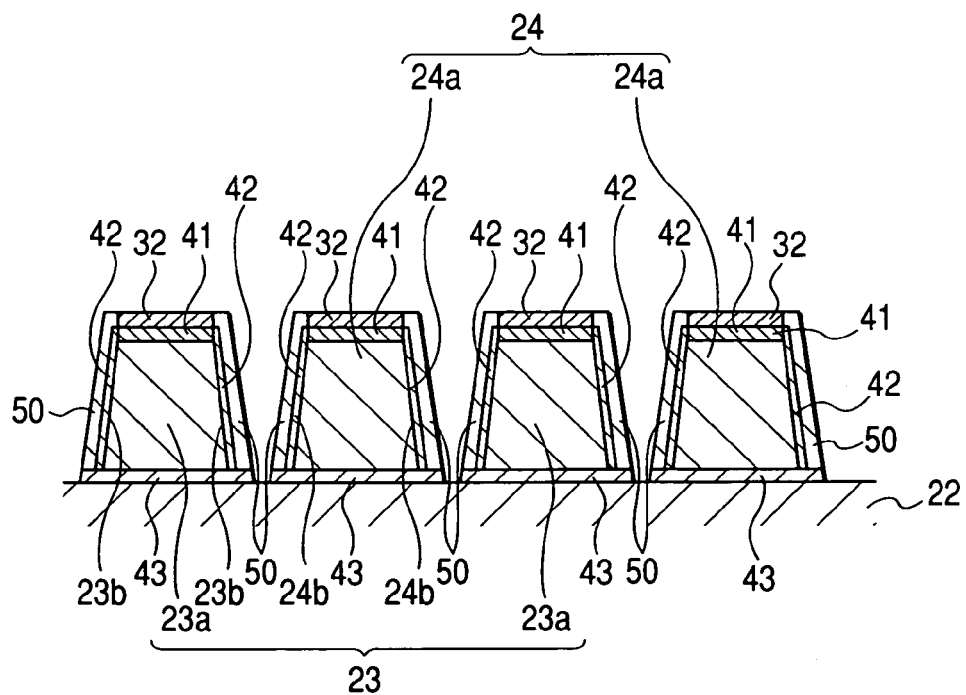
FIG. 8 is a partial cross-sectional view illustrating one process of the another method of manufacturing the surface acoustic wave element of the invention.
Figure 9:
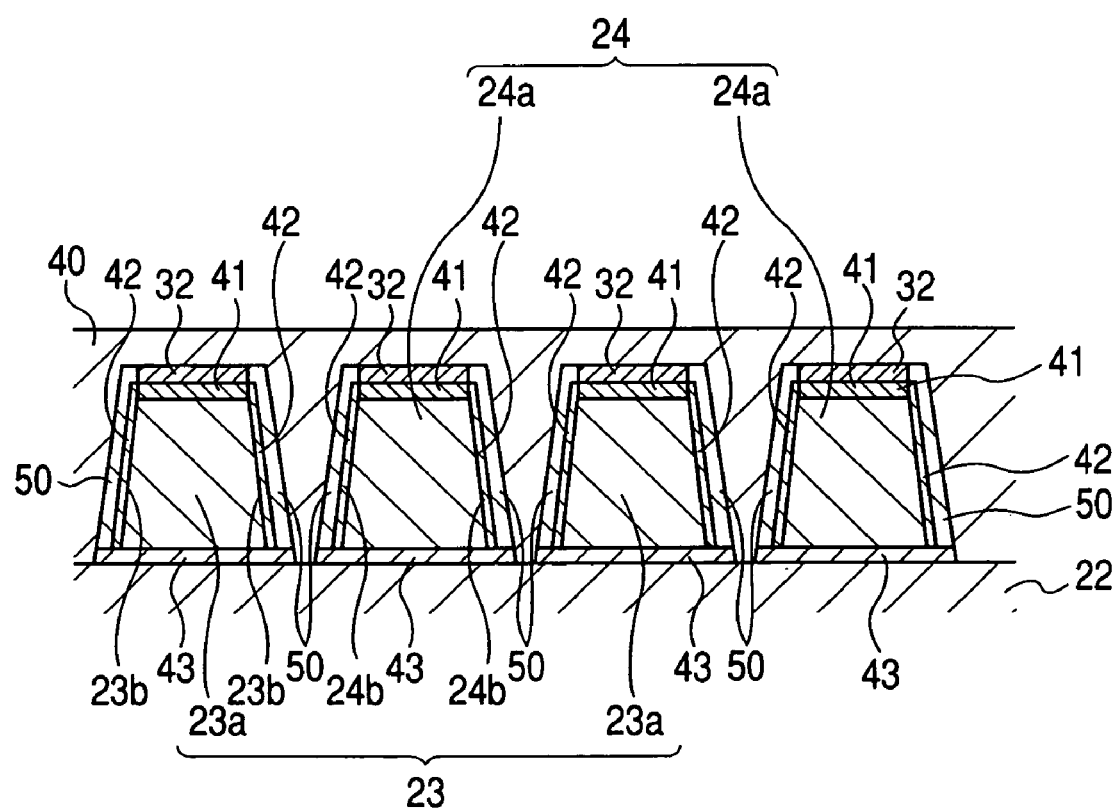
FIG. 9 is a partial cross-sectional view illustrating another process of the another method of manufacturing the surface acoustic wave element of the invention.
Figure 10:
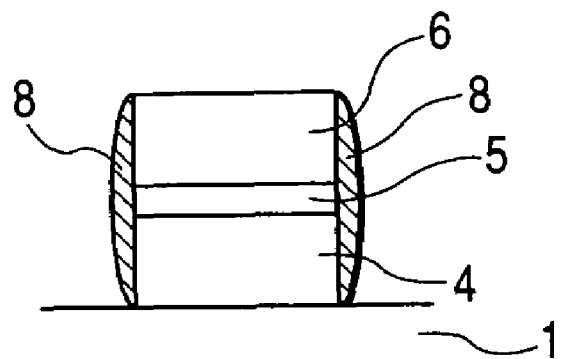
FIG. 10 is a partial cross-sectional view of an electrode of a conventional surface acoustic wave element.
Figure 11:
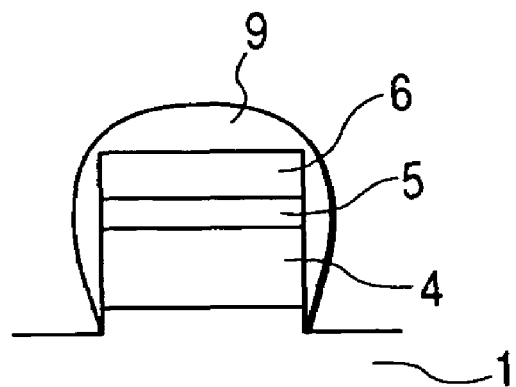
FIG. 11 is another partial cross-sectional view of the electrode of the conventional surface acoustic wave element.
Figure 12:
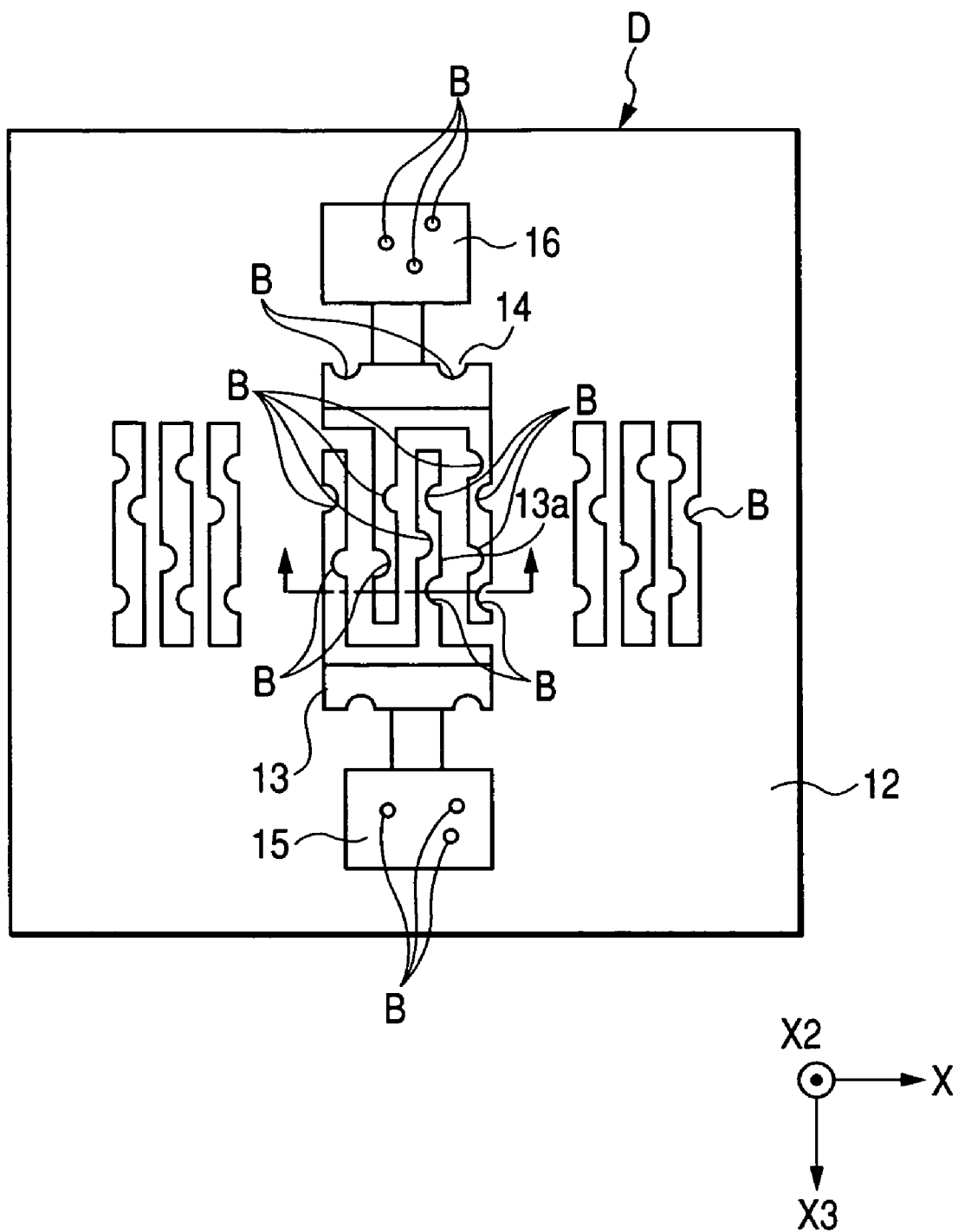
FIG. 12 is a plan view of the electrode of the conventional surface acoustic wave element.
Figure 13:
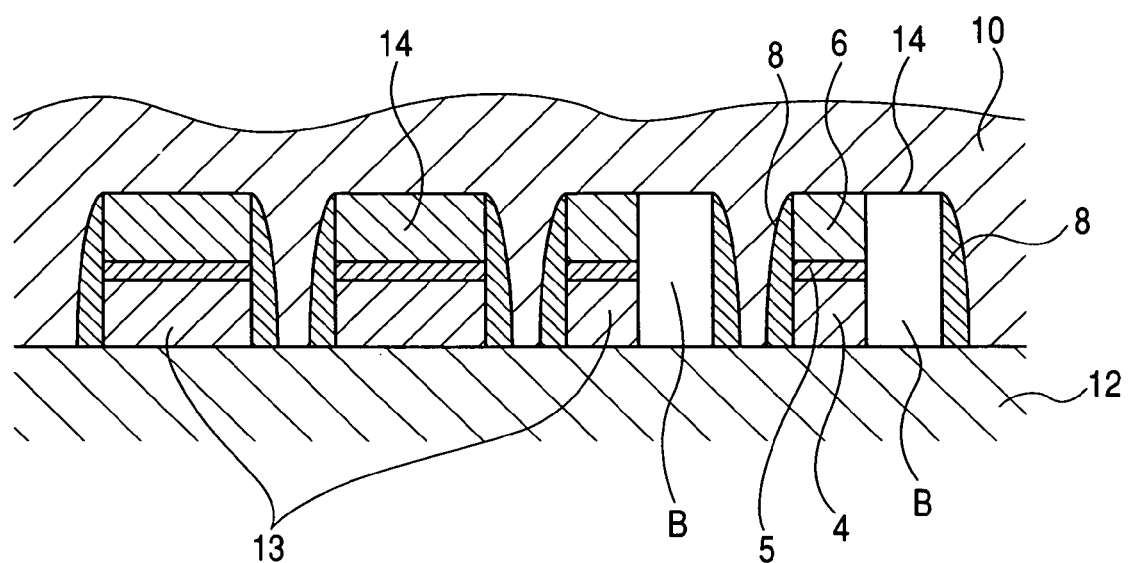
FIG. 13 is a further partial cross-sectional view of the electrode of the conventional surface acoustic wave element.

Next, as shown in FIG. 8, the metal nitride film 50 on the mask layer 33, the mask layer 33, the metal nitride film 50 between the interdigital transducer electrode portions 23 and 24, and the lower dispersion preventing layer 43 are removed through the reactive ion etching (RIE) method or the ion milling method using $CF_4$ gas. In addition, as shown in FIG. 9, the insulating layer 40 is coated on the piezoelectric substrate 22 and the interdigital transducer electrode portions 23 and 24. After applying the insulating layer 40 by the spin coating method, the insulating layer is baked in a nitrogen atmosphere at a temperature of 150° C. for three minutes, thereby removing the solvent of dibutyl ether. In addition, the insulating layer is cured in an atmosphere of oxygen ($O_2$) and vapor ($H_2O$) at a temperature of 400° C. for thirty minutes. Through this curing process, ammonia $NH_3$ or $H_2$ is released, so that the insulating layer 40 becomes a layer containing silicon oxide as a major component.

In addition, through the manufacturing method shown in FIGS. 6 to 9, the upper dispersion preventing layers 41 and the side dispersion preventing layers 42 which are dispersion preventing layers made of 'metal nitride' can be provided between the interdigital transducer electrode portions 23 and 24 and the insulating layer 40.

According to the invention, since the dispersion preventing layers each made of 'the metal nitride' are provided between the interdigital transducer electrode portion and the insulating layer, it is possible to prevent the voids from being generated in the interdigital transducer electrode portions, and thus the power resistance characteristic can be improved. In addition, by forming the insulating layer, variations of a serial resonant frequency and a parallel resonant frequency when the element temperature changes can be reduced.

The invention claimed is:

1. A surface acoustic wave element having a piezoelectric substrate and interdigital transducer electrode portions formed thinly on the piezoelectric substrate, wherein the interdigital transducer electrode portions and the piezoelectric substrate are covered with an insulating layer made of an insulating material having a temperature-elasticity constant variation characteristic opposite to a temperature-elasticity constant variation characteristic of the piezoelectric substrate, and dispersion preventing layers each made of metal nitride are provided between the interdigital transducer electrode portions and the insulating layer such that the dispersion preventing layers are formed at lower sides of the interdigital transducer electrode portions.

2. The surface acoustic wave element according to claim 1, wherein the dispersion preventing layers are formed at sides of the interdigital transducer electrode portions.

3. The surface acoustic wave element according to claim 1, wherein the dispersion preventing layers are formed at upper sides of the interdigital transducer electrode portions.

4. The surface acoustic wave element according to claim 1, wherein the interdigital transducer electrode portion is formed of Cu or a Cu alloy.

5. The surface acoustic wave element according to claim 1, wherein the dispersion preventing layer has one or more of TaN, VN, NbN, TiN, AlN, ZrN, and CrN.

6. The surface acoustic wave element according to claim 1, wherein the piezoelectric substrate is made of $LiTaO_3$, and the insulating material is silicon oxide or aluminum nitride.

7. The surface acoustic wave element according to claim 6, wherein the insulating layer is formed by applying a silicon compound and performing a heat treatment for the applied silicon compound.

8. The surface acoustic wave element according to claim 7, wherein the heat treatment is performed in an atmosphere of any one of oxygen or $H_2O$ or in an atmosphere of oxygen and $H_2O$.

9. The surface acoustic wave element according to claim 7, wherein the insulating layer is an oxide film.

10. The surface acoustic wave element according to claim 1, wherein a cross-sectional shape of the interdigital transducer electrode portion is a trapezoid and an upper base of the trapezoid is shorter than a lower base thereof.

* * * * *